(12) United States Patent
Denison et al.

(10) Patent No.: US 7,847,351 B2
(45) Date of Patent: Dec. 7, 2010

(54) LATERAL METAL OXIDE SEMICONDUCTOR DRAIN EXTENSION DESIGN

(75) Inventors: Marie Denison, Plano, TX (US); Seetharaman Sridhar, Richardson, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 184 days.

(21) Appl. No.: 12/101,608

(22) Filed: Apr. 11, 2008

(65) Prior Publication Data
US 2009/0256199 A1   Oct. 15, 2009

(51) Int. Cl.
*H01L 29/76* (2006.01)
(52) U.S. Cl. ............... 257/343; 257/339; 257/E29.001; 257/E21.409; 257/335; 257/330
(58) Field of Classification Search .......... 257/343, 257/349–350, E29.001, E21.409
See application file for complete search history.

(56) References Cited

U.S. PATENT DOCUMENTS

| | | | |
|---|---|---|---|
| 6,876,035 B2 * | 4/2005 | Abadeer et al. | 257/343 |
| 6,911,696 B2 | 6/2005 | Denison | |
| 6,958,515 B2 | 10/2005 | Hower et al. | |
| 7,145,203 B2 * | 12/2006 | Wang | 257/339 |
| 7,476,934 B2 * | 1/2009 | Yang et al. | 257/335 |
| 2007/0267693 A1 * | 11/2007 | Chien et al. | 257/343 |

FOREIGN PATENT DOCUMENTS

WO    2006136979 A2    12/2006

\* cited by examiner

*Primary Examiner*—N Drew Richards
*Assistant Examiner*—Mamadou Diallo
(74) *Attorney, Agent, or Firm*—Warren L. Franz; Wade J. Brady, III; Frederick J. Telecky, Jr.

(57) ABSTRACT

A semiconductor device comprising source and drain regions and insulating region and a plate structure. The source and drain regions are on or in a semiconductor substrate. The insulating region is on or in the semiconductor substrate and located between the source and drain regions. The insulating region has a thin layer and a thick layer. The thick layer includes a plurality of insulating stripes that are separated from each other and that extend across a length between the source and the drain regions. The plate structure is located between the source and the drain regions, wherein the plate structure is located on the thin layer and portions of the thick layer, the plate structure having one or more conductive bands that are directly over individual ones of the plurality of insulating stripes.

22 Claims, 10 Drawing Sheets

LATERAL METAL OXIDE SEMICONDUCTOR DRAIN EXTENSION DESIGN

TECHNICAL FIELD

The disclosure is directed, in general, to semiconductor devices; and, more specifically, to an electrode plate design for a lateral metal oxide semiconductor (MOS) device, as well as to the manufacture thereof.

BACKGROUND

The continual demand to enhance integrated circuit (IC) performance has resulted in a reduction of semiconductor device geometries, and continual efforts to operate semiconductor devices over a wide range of voltages. In particular, for semiconductor devices such as lateral double-diffused metal oxide semiconductor (LDMOS) transistors, or drain extended MOS (DEMOS) transistors used as high voltage devices (e.g., about 20 Volts and higher), it is often necessary to simultaneously optimize several electrical parameters. These parameters can include the breakdown voltage (BDV), specific on-resistance (Rsp=on-state resistance in linear regime times device area) and switching speed (e.g., as represented by the Rsp*Qgd quality factor, where Qgd is the gate-to-drain charge). Compromises in the value of one or more of these parameters, or to the dimensions of the device, have to be made in order for the device to work in its intended safe operating region.

SUMMARY

The disclosure provides a semiconductor device, comprising source and drain regions, an insulating region and a plate structure. The source and drain regions are on or in a semiconductor substrate. The insulating region is on or in the semiconductor substrate and located between the source and drain regions. The insulating region has a thin layer and a thick layer. The thick layer includes a plurality of insulating strips or fingers that are separated from each other and that extend across a length between the source and said drain regions. A plate structure is located between the source and the drain regions, wherein the plate structure is located on the thin layer and portions of the thick layer, the plate structure having one or more conductive bands that are directly over individual ones of the plurality of insulating strips or fingers.

Another aspect of the disclosure provides an integrated circuit that comprises one of more transistors on or in a semiconductor substrate. At least one of the transistors includes an n-doped source region in a p-doped well of the substrate, and an n-doped drain region in a deep n-doped well of the substrate.

The at least one transistor also comprises an insulating region on or in the deep n-doped well of the substrate and located between the source and drain regions, and a gate electrode structure also located between the source and drain regions. The insulating region has a gate dielectric layer and a shallow trench isolation layer. The shallow trench isolation layer includes a plurality of insulating strips or fingers that are separated from each other and that extend across a length between the source and drain regions. A gate electrode structure is located between the source and the drain regions and on the gate dielectric layer and on portions of the shallow trench isolation layer. The gate electrode structure has one or more conductive bands that are directly over individual ones of the plurality of insulating strips or fingers.

The integrated circuit further includes insulating layers on the semiconductor substrate and covering the one or more transistors. The integrated circuit also includes interconnects formed through one or more of the insulating layers to electrically connect the one or more transistors to each other, or to other active or passive components of the integrated circuit.

In another embodiment of the integrated circuit, the one or more transistors in or on the substrate include a p-doped source region in an n-doped well of the substrate and a p-doped drain region in a deep p-doped well of the substrate, and the insulating region is on or in the deep p-doped well of the substrate located between the source and drain regions. The insulating region has the gate dielectric layer and shallow trench isolation layer as described above. The integrated circuit also includes the above-described gate electrode structure, insulating layers and interconnects.

Another embodiment comprises a method of manufacturing a semiconductor device. The method comprises forming one or more doped layers in or on a semiconductor substrate, and forming an insulating region in or on the semiconductor substrate, and over and aligned with one of the doped layers. Forming the insulating region includes forming a thick layer and forming a thin layer. The thick layer is formed with a plurality of insulating strips or fingers that are separated from each other and that extend across a length of a second one of the doped layers. The thin layer is formed on an upper surface of the semiconductor substrate. The method also includes forming a plate structure on the thin layer and portions of the thick layer. The plate structure has one or more conductive bands that are directly over individual ones of the plurality of insulating strips or fingers.

BRIEF DESCRIPTION OF DRAWINGS

The disclosure makes reference to example embodiments and to accompanying drawings, wherein.

DETAILED DESCRIPTION OF EXAMPLE EMBODIMENTS

The present disclosure benefits from the recognition that improvements in one or all of BDV, Rsp, and Rsp*Qgd quality factor can be obtained using a novel configuration of field plate and insulating structures in a semiconductor device. These improvements are made by configuring the plate structure of a semiconductor device (e.g., the gate electrode structure of LDMOS or DEMOS transistors) to have portions (e.g., conductive bands) that lay on, and overlap with, portions (e.g., insulating strips or fingers) of an insulating region that includes a thick layer (e.g., shallow trench or field oxide isolation structures) of the device. These plate structure and insulating region configurations permit a greater degree of drain extension depletion than previously recognized. That is, the shape, dimensions, degree of overlap and spacing of the conductive bands and insulating strips or fingers are newly recognized result-effective variables that can be used to control the BDV, Rsp, Rsp*Qgd quality, and other properties of the semiconductor device.

Figure 1A:
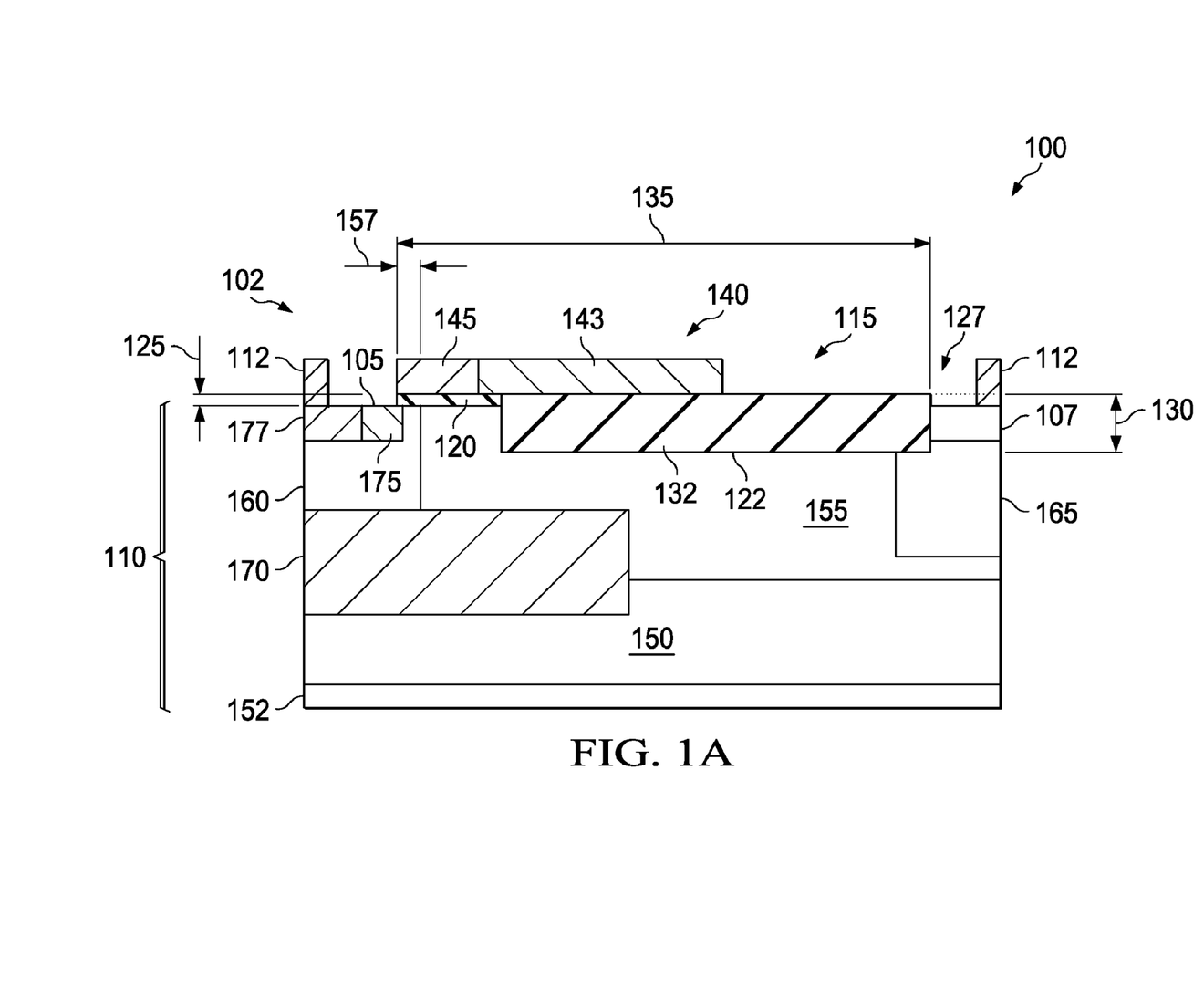
FIG. 1A is a cross-sectional view of a semiconductor device to which an example implementation of the disclosure can be applied.
Figure 1B:
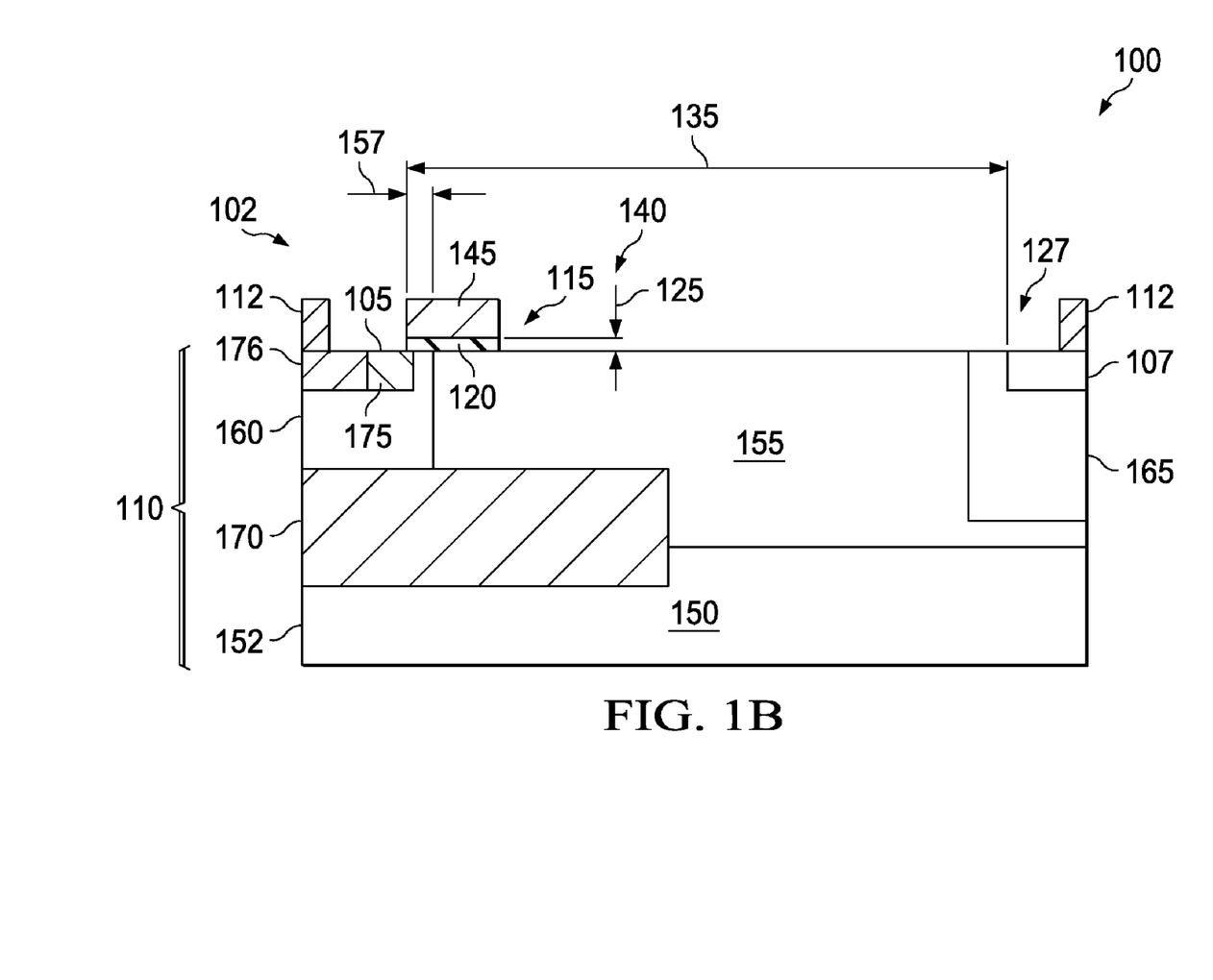
FIG. 1B is a second cross-sectional view of the semiconductor device to which an example implementation of the disclosure can be applied.
Figure 2:
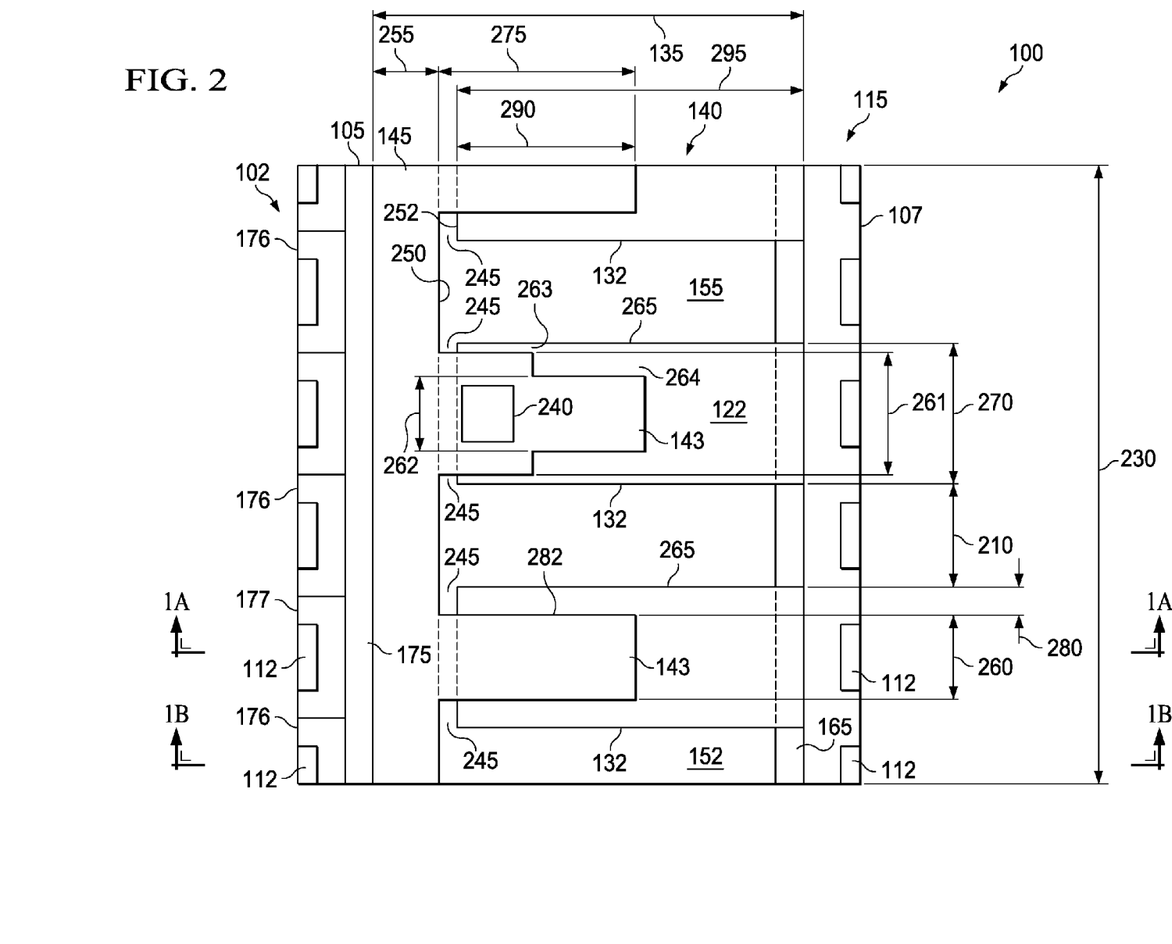
FIG. 2 is a plan view of the semiconductor device depicted in FIGS. 1A and 1B.

FIGS. 1A and 1B present cross-sectional views of a semiconductor device 100 to which an example implementation of the disclosure can be applied. FIG. 2 presents a plan view of the semiconductor device 100 depicted in FIGS. 1A and 1B. The cross-sectional views shown in FIGS. 1A and 1B correspond to views taken along the section lines 1A-1A and 1B-1B, respectively, in FIG. 2.

FIGS. 3-6 present plan views of different embodiments of the semiconductor device 100 to which example implementations of the disclosure can be applied. Like reference numbers are used to represent like structures. Example semiconductor devices 100 include transistors 102 optimized for a low Rsp and high current capability, such as LDMOS or DEMOS transistors, or an integrated circuit having at least one such transistor 102.

Figure 4:
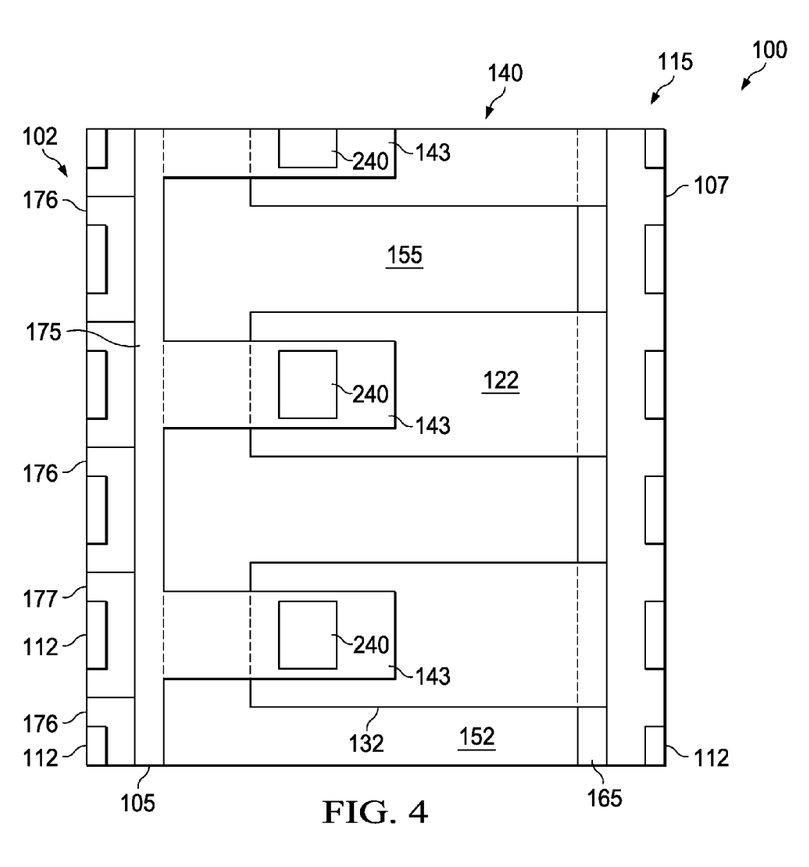
Figure 5A:
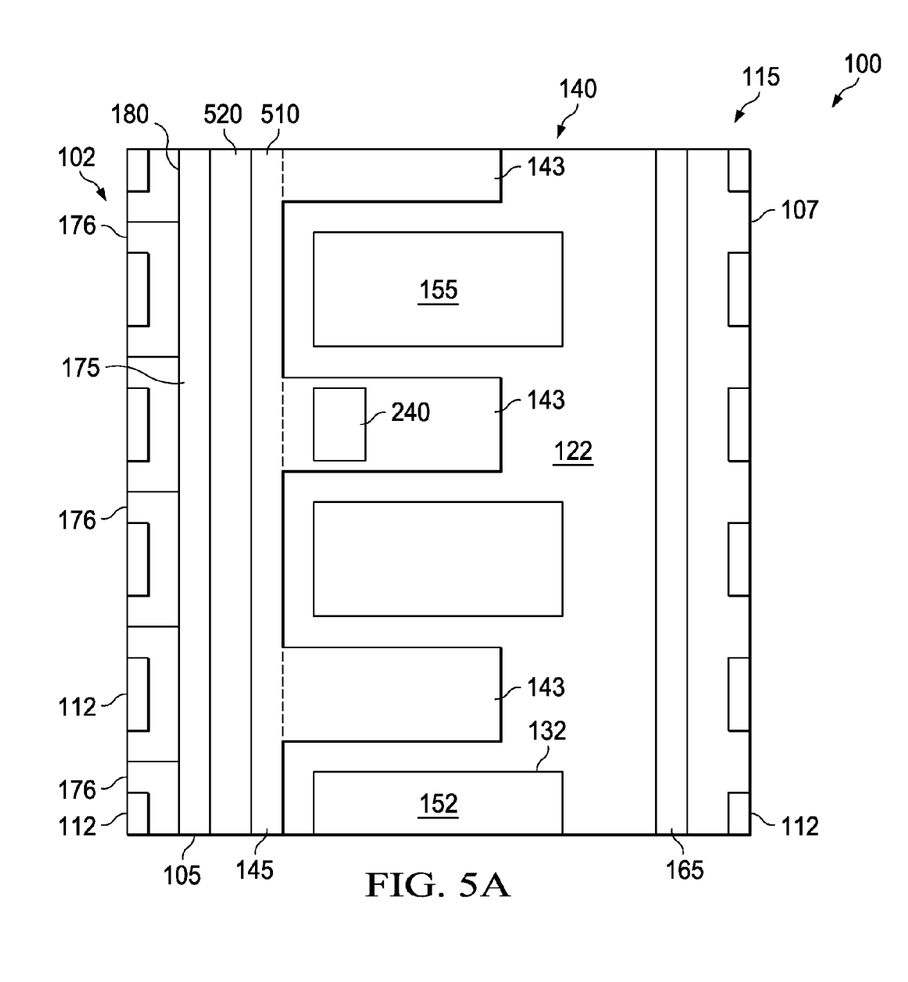
Figure 5B:
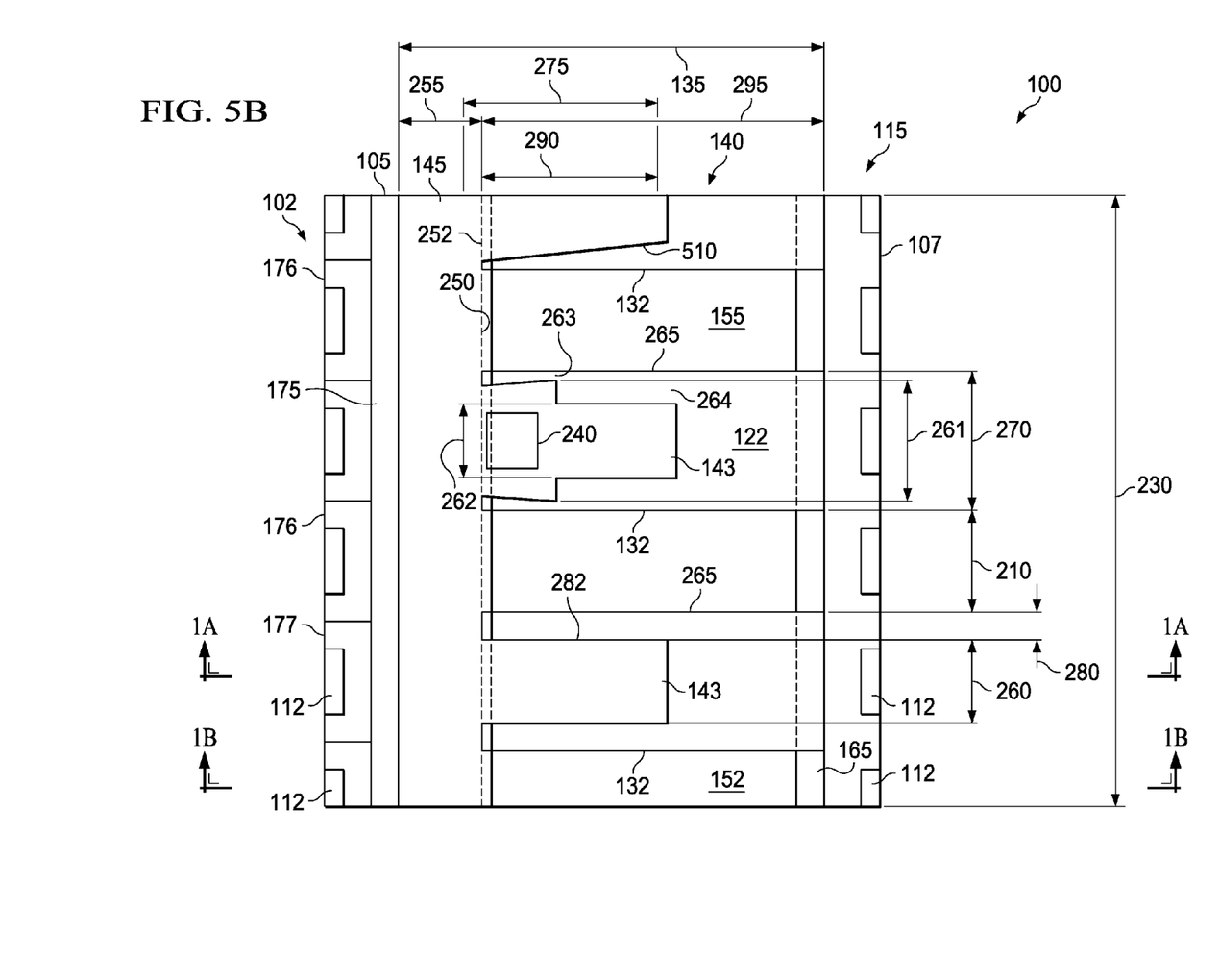
Figure 6:
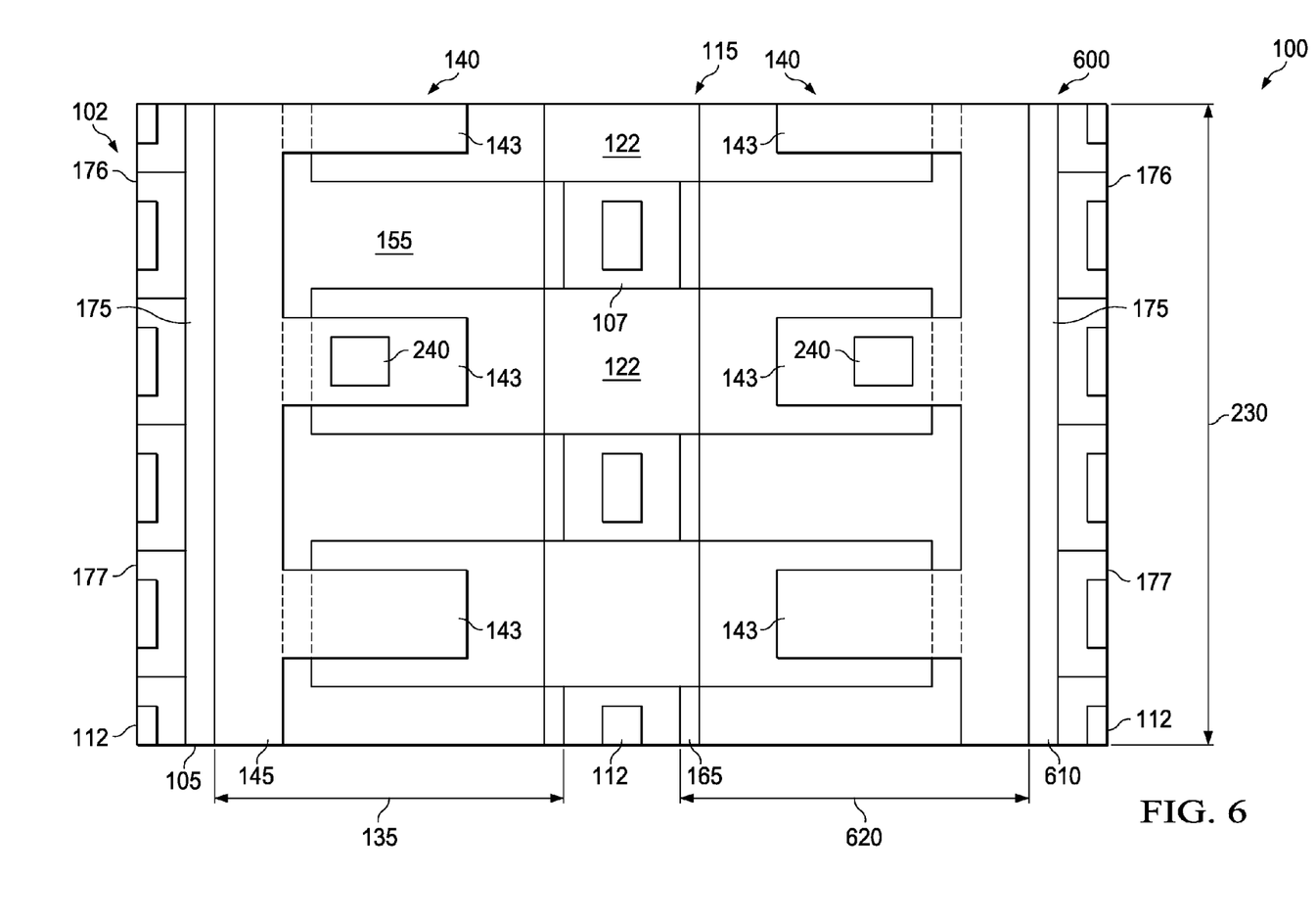

The example semiconductor devices 100 depicted in FIGS. 1A-6 are shown in elemental configurations, which could be repeated multiple times in the final device. The contacts are cut in their centers at the edges. The device 100 can comprise multiple replicas of the disclosed component parts, by copying and mirroring these parts in horizontally or vertical pitch directions. For example, the plan views in FIGS. 2-5 present about 1 pitch unit horizontally across the figure (one pitch unit horizontally being, by convention, a length dimension of the transistor 102) and about 2.5 pitch units vertically across the figure (one pitch unit vertically being, by convention, a width dimension of the transistor 102). FIG. 6 presents about 2 pitch units in the horizontal direction across the figure and about 2.5 pitch units vertically across the figure. Additionally, the example devices 100 depicted in FIGS. 1A-7 are configured as n-type MOS transistors 102. However, the disclosure also includes devices that are configured as p-type MOS transistors or combinations of n-type or p-type MOS transistors. One of ordinary skill in the art would understand how to fabricate p-type MOS transistors in accordance with the invention, e.g., by inverting the type of dopants in the wells, as compared to that described for the n-type MOS transistors.

The device 100 shown in FIG. 1A includes source and drain regions 105, 107 (e.g., source and drain contact diffusion regions) in a semiconductor substrate 110. Electrode contacts 112 and further conductive layers in the back end of (manufacturing) line (BEOL) can connect the source and drain regions 105, 107 to other components of the device 100 on or in the substrate 110. Embodiments of the semiconductor substrate 110 include substrate wafers such as silicon wafers and any layers (e.g., one or more epitaxial layers of silicon, doped buried layers, silicon-on-insulator, partial silicon-on-insulator, cavities) formed thereon or therein. In some cases, the substrate 110 is a p-doped substrate.

The device 100 also includes an insulating region 115 on or in the substrate 110, and located between the source region 105 and the drain region 107. The insulating region 115 has a thin layer 120 and a thick layer 122.

In some embodiments, the thin layer 120 comprises a gate dielectric layer, and the thick layer 122 comprises a shallow trench (STI) or field oxide (FOX) structure. For example, the thin layer 120 can be a silicon oxide gate dielectric layer having a thickness 125 of from about 1 to 100 nm. The thin layer 120 is located on an upper surface 127 of the substrate 110. The thick layer 122 can be an isolation structure (e.g., shallow trench isolation (STI) structure, a deeper oxide trench, or a field oxide (FOX) isolation structure) having a thickness 130 of about 0.35 microns or more. It can be a trench going into the substrate, or a layer above the surface of the substrate, or a combination of both.

The thick layer 122 includes a plurality of insulating strips or fingers (hereafter "fingers") 132 that are separated from each other and that extend across a length 135 between the source and drain regions 105, 107. As illustrated in FIG. 2, the plurality of insulating fingers 132 are separated from each other. That is, there is a gap 210 between individual fingers 132 that are adjacent to each other.

The thickness of the thick insulating regions may vary across the fingers 132, in both length and width directions. For example, the stepped oxide thickness from source to drain side, can be formed by using a double field oxide process, or by depositing and structuring a second insulating layer on top of a first one and forming an oxide step, preferably with the thicker oxide portion on the drain side.

In some devices 100, the length 135 is from about 1 to 10 μm. In some cases, the fingers 132 extend across the entire length 135 and contact the source region 105. In other cases, such as shown in FIGS. 1A, 1B and 2, the fingers 132 partially extend across the length 135 between the source and drain regions 105, 107. In some devices 100, the gap 210 between adjacent fingers 132 is from about 50 nm to 1 um.

As also shown in FIG. 1A, the device 100 further includes a plate structure 140 located between the source and drain regions 105, 107. At least a part, and in some cases all, of the plate structure 140 can be a gate electrode (e.g., a polysilicon gate electrode) of a MOS transistor 102. In cases where only a part of the plate structure 140 is the gate electrode, the other parts of the plate structure 140 can be connected to independent nodes, e.g., set at a potential equal to the minimum source voltage for a source-sided field plate, or set close to the maximum drain voltage for a drain-sided field plate. The plate structure 140 is located on the thin layer 120 and located on portions of the thick layer 122. As shown in FIGS. 1A and 2, the plate structure 140 has one or more conductive bands 143 that are directly over (e.g., overlapping with) individual ones of the insulating fingers 132.

In some embodiments, the plate structure 140 further comprises a conductive segment 145 (FIGS. 1A and 2) adjacent to, and substantially traversing a width 230 of, the source region 105. In some cases, the source and drain regions 105, 107 are substantially the same width 230, and the conductive segment 145 also substantially traverses the width 230 of the source region 105. For example, the conductive segment of width 230 of the plate structure 140 is continuously adjacent to the source region 105. In other cases, however, the conductive segment 145 can be discontinuous structure, such that separate segments 145 are adjacent to portions of the source region 105.

Note that if the surface of the substrate not covered by thick insulation oxide or other blocking materials is silicided by default in the process flow where the device is implemented, this silicidation has to be masked in the openings between the thick insulation bands 132 to avoid shortening of the drain extension and to maintain voltage blocking capability.

As shown in FIG. 2, in some embodiments, one or more of the conductive bands 143 can be continuous with, and project perpendicularly from, the conductive segment 145. For example, both the conductive bands 143 and the conductive segment 145 can be formed from a single conductive material (e.g., a single polysilicon layer) that is patterned to form these structures. In such cases there can be an electrode contact 240 that connects the plate structure 140 to a voltage source (not shown) that is, e.g., configured to switch the device on and off. There can be one or more contacts 240 depending on the available conductive segment area 145 (e.g., polysilicon). One or more electrode contacts 240 can directly touch the conductive segment 145 of the plate structure 140.

In other embodiments, one or more of the conductive bands 143 are separated from the conductive segment 145. That is, one or more of the conductive bands 143 are not in direct contact with the conductive segment 145. In some cases, some of the conductive bands 143 are continuous with the conductive segment 145, while other conductive bands 143 are separated from the conductive segment 145. In still other cases, however, all of the conductive bands 143 are separated from the conductive segment 145. In these cases, there can be one or more electrode contacts 240 that contact the separate conductive bands 143. For some devices 100 having conductive bands 143 that are separated from the conductive segments 145, the device 100 advantageously has a lower gate-drain capacitance, thereby increasing the switching speed and reducing the switching losses of the device 100.

Figure 3:
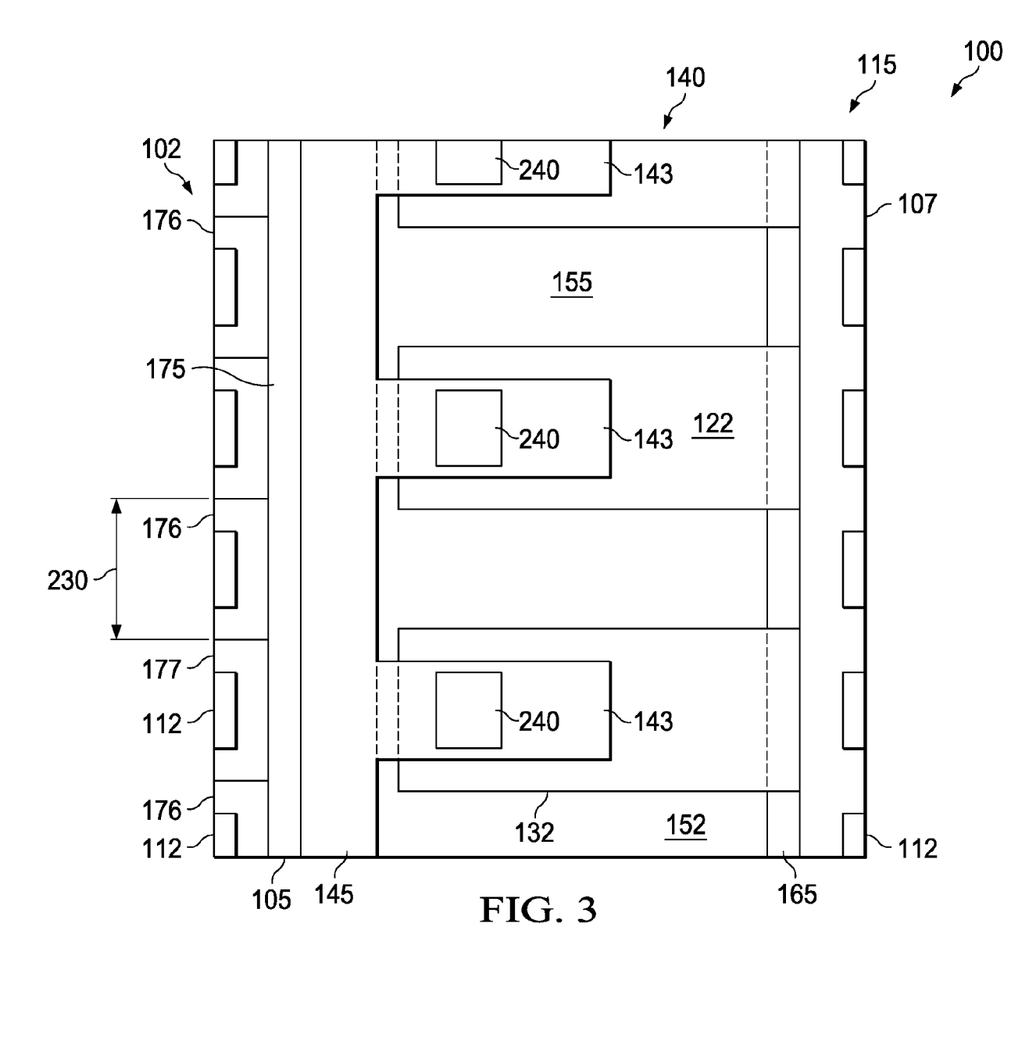
FIGS. 3-6 are plan views, similar to the view of FIG. 2, of different embodiments of semiconductor devices to which example implementations of the disclosure can be applied.

FIGS. 2 and 3 show embodiments of the conductive segment 145 that are a continuous structure substantially traversing source region's width 230. In yet other embodiments (FIG. 4), there is no conductive segment 145, and the plate structure 140 consists essentially of two or more conductive bands 143. As illustrated in FIG. 4, each of the separated conductive bands 143 can each have a separate electrode contact 112. Each of the separated conductive bands 143 can be adjacent to portions of the source region 105.

In some embodiments (e.g., FIGS. 2 and 3), the conductive segment 145 is separated from the insulating fingers 132. For example, there can be a gap 245 (FIG. 2) between the edge 250 of the conductive segment 145 and the tips 252 of the insulating fingers 132 that comprise the thick layer 122. The thin layer 120 is typically only underneath the plate structure 140. For example, the thin layer 120 can be etched such that it is self-aligned with the plate structure 140, including the conductive segment 145, and those portions of the conductive bands 143 that are not over the thick layer 122. Consequently, the thin layer 120 is not visible in the plan view of the device 100 depicted in FIG. 2, or in similar plan views.

In another embodiment (FIG. 5A), the conductive segment 145 overlaps at least one of the plurality of insulating fingers 132. That is, the thick layer 122 of the insulating region 115 that comprises the fingers 132 lies directly under at least a portion 510 of the conductive segment 145. In such cases, the thin layer 120 can lie directly under a second portion 520 of the conductive segment 145, but does not lie between the conductive segment 145 and the tips 252 (see FIG. 2) of the insulating fingers 132. Having portions 510 of the conductive segment 145 overlap with the thick layer 122 allows a higher voltage to be applied at this position, and can be advantageous in terms of electrical performance and safe operating region. In the example of FIG. 5A, the thick insulation fingers 132 are connected to each other along the drain region 107. This configuration can be advantageous for instance in engineering the surface doping profiles of the shallow n-doped well (discussed below) and drain diffusion for BVD.

As shown in FIG. 5B, in still other embodiments, the conductive segment 145 (e.g., polysilicon) overlaps with no gap 245 (see FIG. 2), or furthermore overlaps over the spaces between thick insulating layer fingers 132.

In some cases, the presence of the conductive bands 143 on the insulating fingers 132 allows the conductive segment 145 to be narrower than possible in devices not having such features. That is, the conductive segment 145 can have a narrower length 255 (FIG. 2) than in an analogous device without such features. In devices which do not have the insulating fingers and conductive bands over them, the length 145 is often limited by reliability (e.g., minimum hot carrier drift) requirements: if the p-doped well layer 160 is too close to the thick insulation layer 122, at high gate and drain voltage, a large current density crosses a narrow bottleneck between the output of the channel and the bottom of the thick insulation layer 122. Depending on the bias conditions and device details, a large hot carrier current can be injected into the thin gate oxide 120 and thick isolation layer 122 and their interfaces to this region, causing a significant drift in electrical parameters during operation. In the proposed design, depending on the spacing and the width of the insulating fingers 132, the current can better spread into the drain, causing less high energy carrier injection into the insulating layers and thus improving the device lifetime safe operating region, or allowing one to reduce the length of the segments 145 and thus the device source-to-drain pitch and Rsp.

In some cases, the plate structure 140 has an edge 250 (e.g., the edge of the conductive segment 145) that can be located further back from the drain region than otherwise possible, thereby providing a larger drain to thin dielectric edge 250 space in which depletion can occur reducing the maximum electric field across the thin dielectric layer. Consider, e.g., an equivalent device to that depicted in FIGS. 1A-2, but whose plate structure and insulating region have no conductive bands, and no insulating fingers, respectively. The length 255 of the conductive segment of the device 100 depicted in FIGS. 1A-2, can be up to 50 percent narrower than in this otherwise equivalent device.

In some cases, all of the conductive bands 143 have a uniform width 260 over individual ones of the insulating fingers 132. In other cases, at least one, and sometimes all, of the conductive bands 143 have at least two different widths 261, 262 (FIG. 2) over a respective one of the insulating fingers 132. In the latter cases, there can be at least two different corresponding gaps 263, 264 between the conductive band 143 and an edge 265 of the underlying insulating stripe 132. For instance, consider the case where the conductive bands 143 each have two different widths 261, 262. It is sometimes advantageous for the width 262 of the conductive band 143 part that is closer to the drain region 107 to be smaller than the width 261 of the conductive band 143 part that is further from the drain region 107 (or for the corresponding gap 264 to be larger than gap 263). A smaller gap 263 towards the source 105 side of the insulating fingers 132 forms a field plate of larger capacitance to the drain extension at this position, which helps to deplete the drain extension in the fingers 132 (thereby improving the voltage blocking capability of the device), to decrease the electric field at the thin gate oxide layer 145 edge, and to decrease the Rsp by increasing the area of the accumulation region in the vicinity of gap 245 (see FIG. 2) and by allowing a higher drain extension doping in the fingers 132 (due to a stronger depletion effect for a given breakdown voltage). A decreasing gap 263, 264 (or increasing width 261, 262) from the drain 107 towards the source 105 side of the insulating fingers 132 is facilitated by there being a voltage drop along this direction. The voltage drop is such that the electric field across the thick layer 122 can be maintained sufficiently low along the drain extension (e.g., the deep n-type well 155, as discussed below) in spite of a decreasing isolating layer thickness and while maximizing drain extension depletion between the thick insulating fingers 132.

A device configuration having conductive bands 143 having at least two different widths 261, 262 is advantageous because it allows increasing the drain depletion and thus improving the Rsp-BVD trade-off, while keeping an acceptably low electric field (e.g., about 1.5 MV per cm, or less) across the interlayer dielectric between the field plate edge 282 and an edge 265 of the drain extension located between insulating fingers 132 (e.g., the moat region corresponding to the deep n-type well 155 in the substrate 110) located between the source and drain regions 105, 107. A low electric field is desirable for thick dielectric layer 122 integrity during operation. Such configuration is also advantageous because it allows an increase in the depletion effect in the drain extension (e.g., in deep n-type well 155) near the source 105 side of the transistor 102 (e.g., channel region 157). This, in turn, can permit an increase in the deep n-type well doping between the fingers 132 near the source side, thereby reducing the resistance, or can allow a reduction in the length 135 between the source 105 and drain 107, and thus a decrease in the total area occupied by the device 100. In both cases, Rsp of the device 100 is beneficially reduced.

The widths 260, 261, 262 are preferably kept close to minimum (or corresponding gaps 280, 263, 264 kept to maximum), according to the technology lithography capability (e.g., minimum gate electrode feature size, or, in case of a contact placed over 132, minimum contact size and minimum overlap of gate electrode over contact edge).

In some cases, the gap 263 of the conductive band 143 nearer to the source 105 can be from about 50 nm to 500 nm. In such cases, the larger gap 264 of the conductive band 143 nearer to the drain 107 can be from 100 nm to 1 um. The minimum gaps 263, 264 can also be limited by the process capability in terms of alignment of the conductive band edges to the corresponding edges of the insulating fingers 132.

Although the embodiment in FIG. 2 depicts a conductive band 143 having two discrete widths 261, 262, in other cases the width of the conductive band 143 can gradually decrease from a larger width 261 to a smaller width 262 towards the drain region 107. The width of such conductive bands 143 can be tapered stepwise or continuously from source 105 to drain 107 to vary the depletion effect along the drain extension (see, for example, edge 510 in FIG. 5B). The change in width 261, 262 (or corresponding gaps 263, 264) can be over the entire length 275 of the conductive band 143, or over a shorter portion of its length 275. When the conductive band 143 is a continuously tapered structure, the minimum conductive band width 263 may be limited by the lithography process used. The length 275 of the conductive bands 143 can be adjusted to change the electric field profile across the drain extension deep n-doped well 155, so as to change the Rsp and BDV, and to optimize the safe operating region of the device 100.

Similarly, for conductive bands 143 having a uniform width 260, adjustment of the gap 280 (FIG. 2) between an edge 282 of the conductive band 143 and an edge 265 of the underlying insulating stripe 132 can be advantageously used to optimize the BVD and Rsp.

Changing the gap 210 between adjacent insulating fingers 132 can also be used to adjust the BDV and Rsp. For instance, increasing the gap 210 can favorably lower Rsp, but this can be limited by the depletion range of the conducting bands 143, and at a certain gap 210 value, the BDV can decrease. Therefore, there is a trade-off between desirably reducing Rsp and undesirably reducing BVD. In some embodiments, the gap 210 is equal to about twice the length of the depletion region caused in the substrate 110 by the presence of the conductive bands 143. For example, in some embodiments of the device 100, this trade-off is achieved when the gap 210 is from about 0.2 to 1 micron.

Increasing the amount of overlap between the conductive band 143 and its underlying insulating stripe 132 can decrease Rsp and increase or decrease the BDV. For example, in some embodiments, a length 290 of the conductive band 143 on its insulating stripe 132 is from about 20 to 80 percent of a total length 275 of the band 143. Increasing the amount of overlap in this range can decrease Rsp by about 5 percent, whereas the BVD may increase (first 50% overlap of the conductive band 143 of the total length 275) or decrease (longer overlap) by about 20 percent. In some cases, the length 295 of the insulating fingers 132 is substantially the same for all of the fingers 132 and is from about 50 to 80 percent of the length 135 between the source and drain regions 105, 107.

As illustrated in FIGS. 2-5, the insulating region 115 (including the fingers 132 of the thick layer 120 of the insulating region 115) can be located in the drain extension between the source region 105 and the drain region 107 of the device 100. In some embodiments (FIG. 6), however, the insulating region 115 can also be a structure in a second transistor 600 that is adjacent to the first transistor 102. For example, portions of the insulating region 115 can also be located between the second source region 610 and drain region 107 of the second transistor 600. As illustrated in FIG. 6, the first and second transistors 102, 600 can share the drain region 107.

One or more layers of the plurality of thick layers 122 of the insulation region 115 can extend over the drain region 107 and across the length 135 between the source and drain regions 105, 107, and across a second length 620 between the drain region 107 and the second source region 610. In some cases, the drain region 107 can be a continuous structure that is substantially equal to the width 230 of the source region 105. In such embodiments, the insulating fingers 132 of the thick layer 122 can be configured as, e.g., STI layers formed on the surface 127 of the substrate 110 and over the drain region 107. In other cases, the drain can comprise a plurality of discrete drain region 107. The discrete drain regions 107 can be separated by individual insulating fingers 132 of the thick layer 122 that are configured as, e.g., STI layers formed in the substrate 110 and between the source regions 105, 610.

FIGS. 1A and 1B shows additional aspects of the example device 100, including various structures that are part of the semiconductor substrate 110, and can be components of the device 100 or one of its transistors 102. The substrate 110 can include n-doped layer 150 (e.g., an n$^+$-doped buried layer, NBL, or in other embodiments n-doped epitaxial layer, NEPI) on or in a semiconductor wafer 152. There can be a deep n-doped well 155 (DNWELL) on the n-doped layer 150. The deep n-doped well 155 can be or include the drain extension region of the transistor 102. A p-doped well 160 (PWELL) and a shallow n-doped well 165 (SNWELL) can both be located over the n-doped layer 150 and within the deep n-doped well 155. The p-doped well 160 can be or be part of the backgate region of the transistor 102. The backgate p-doped well 160 can be double diffused with an n-doped surface implant 175. In such cases the p-doped well 160 is a double-diffused well (DWELL). In some cases, the source diffusion 175 can also serve as a source contact region 176 (FIG. 2). The overlap of the plate structure 140 with the p-doped well 160 defines the location of a channel region 157 of the transistor 120. In some cases, a double-diffused well can be implanted in self-alignment to the polysilicon edge, and the differential outdiffusion of the source (e.g. Arsenic) and backgate (e.g. Boron) dopants during following furnace process determines the channel length. The n-type dopants of the deep n-doped well 155 are deeper in the substrate 110 (e.g., the substrate wafer 152 or its overlaying layers) than the n-type dopants of the shallow well 165. The deep n-doped well 155 can have a lower concentration of n-type dopants than the shallow well 165. A p-doped buried layer 170 (e.g., a p-doped reduced surface field, RESURF, layer) can be on the n-doped layer 150 in the deep n-doped well 155 (e.g., in contact with the p-doped well 160 configured as the back-gate). In other cases, however, the p-doped reduced surface field layer 170 can be floating or isolated from the p-doped well 160 or in contact with the substrate 152 (e.g., with no n+-doped buried layer 150 under at least a portion of 170).

The source region 105 can include, or be, an n-doped source region in the p-doped well 160 (e.g., p-doped well 160 includes the source). The drain region 107 can be on or in the shallow well 165.

One skilled in the art would appreciate that many alternative embodiments of the substrate 110 and its component parts are possible other than those depicted in FIGS. 1A and 1B. Example alternative embodiments include those presented in U.S. Pat. Nos. 6,958,515 and 6,911,696, which are incorporated by reference in their entireties.

Figure 7:
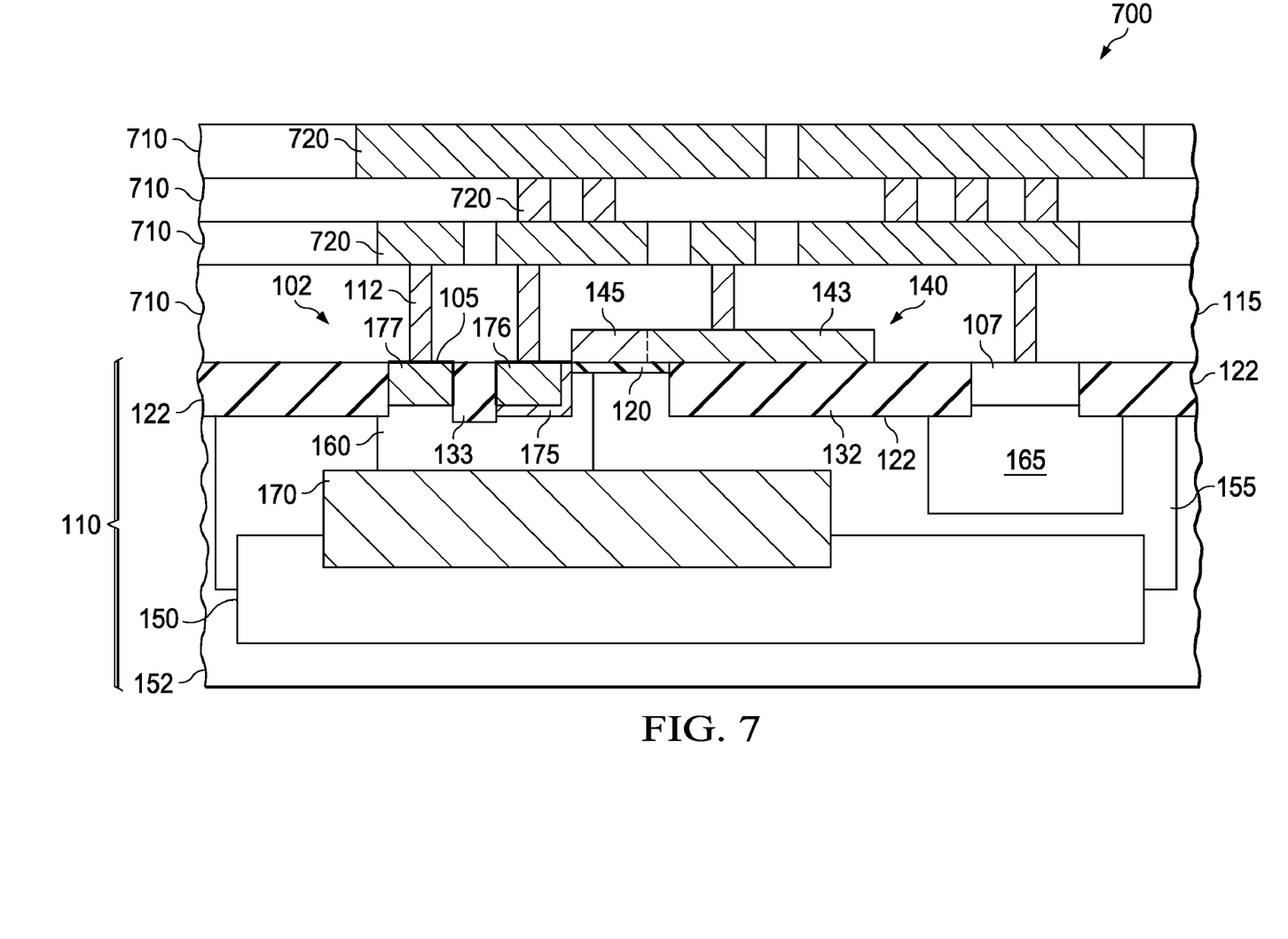
FIG. 7 is a cross-sectional view of an integrated circuit to which an example implementation of the disclosure can be applied.

For example, when the device 100 comprises a DEMOS transistor 102, the source contact region 176 (which is not necessarily the same as the source along the gate edge and, e.g., can be the source/drain implant of a low voltage NMOS), and p-doped well contact region 177 (which is not p-doped well 160 and, e.g., can be a highly doped p+ implant inside of p-doped well 160 to create a good surface ohmic contact to the contact metal plug, such as, for example, used in a low voltage PMOS transistor processed in the same technology flow) could be separated by spacing or by some portion of thick insulating region 133, for example STI, as illustrated in FIG. 7.

For example, fingers 132 of the insulating region 115 that are located between the source and drain regions 105, 107 can be on or in the deep n-doped well 155 of the substrate 110, or, in some cases, over at least part of the n-doped layer 150. For the example device 100 shown in FIGS. 1A and 1B, the thin layer 120 can be a gate dielectric layer. The thick layer 122 can be an STI layer having a plurality of fingers 132 that are separated from each other that extend across the length 135 between the source and drain regions 105, 107.

For example, the plate structure 140 can include, or be, a gate electrode structure located between the source and drain regions 105, 107. The gate electrode structure 140 can be on portions of the thick layer 122 configured as an STI layer. The gate electrode structure 140 has one or more conductive bands 143 that are directly over individual ones of the insulating fingers 132.

FIG. 7 presents a cross-sectional view of an integrated circuit (IC) 700 to which an example implementation of the disclosure can be applied. The cross-sectional view shown in FIG. 7 is analogous to that shown in FIG. 1A, except with a more expanded view for a single source-drain pitch. The IC 700 depicted in FIG. 7 can have one of more transistors 102 on a semiconductor substrate 110. At least one of the transistors 102 includes one of the above-described embodiments of the source and drain regions 105, 107, substrate 110, insulating region 115 and plate structure 140.

As illustrated in FIG. 7, the at least one transistor 102 includes an n-doped source region 105 in a p-doped well 160 of the substrate 110 and an n-doped drain region 107 in a deep n-doped well 155 of the substrate 110. As illustrated, the n-doped drain region 107 can also be in a shallow well 165 of the substrate 100. The transistor 102 also includes an insulating region 115 on or in the deep n-doped well 155 of the substrate 110. The insulating region 115 can be located between the source and drain regions 105, 107. The insulating region 115 has a thin layer 120 (here configured as a gate dielectric layer) and a thick layer 122 (here configured as an STI layer). The STI layer 122 includes a plurality of insulating fingers 132. The insulating fingers 132 are separated from each other and extend across a length 135 between the source and drain regions 105, 107.

The IC 700 further includes insulating layers 710 on the semiconductor substrate 110 and covering the transistors 102 of the IC 700. The IC 700 also includes interconnects 720 (e.g., metal contacts, vias, or lines) formed through one or more of the insulating layers 710 to electrically connect the transistors 102 to each other, or to other active or passive components of the IC 700, or to contact pads that connect the IC to external structures.

Figure 8:
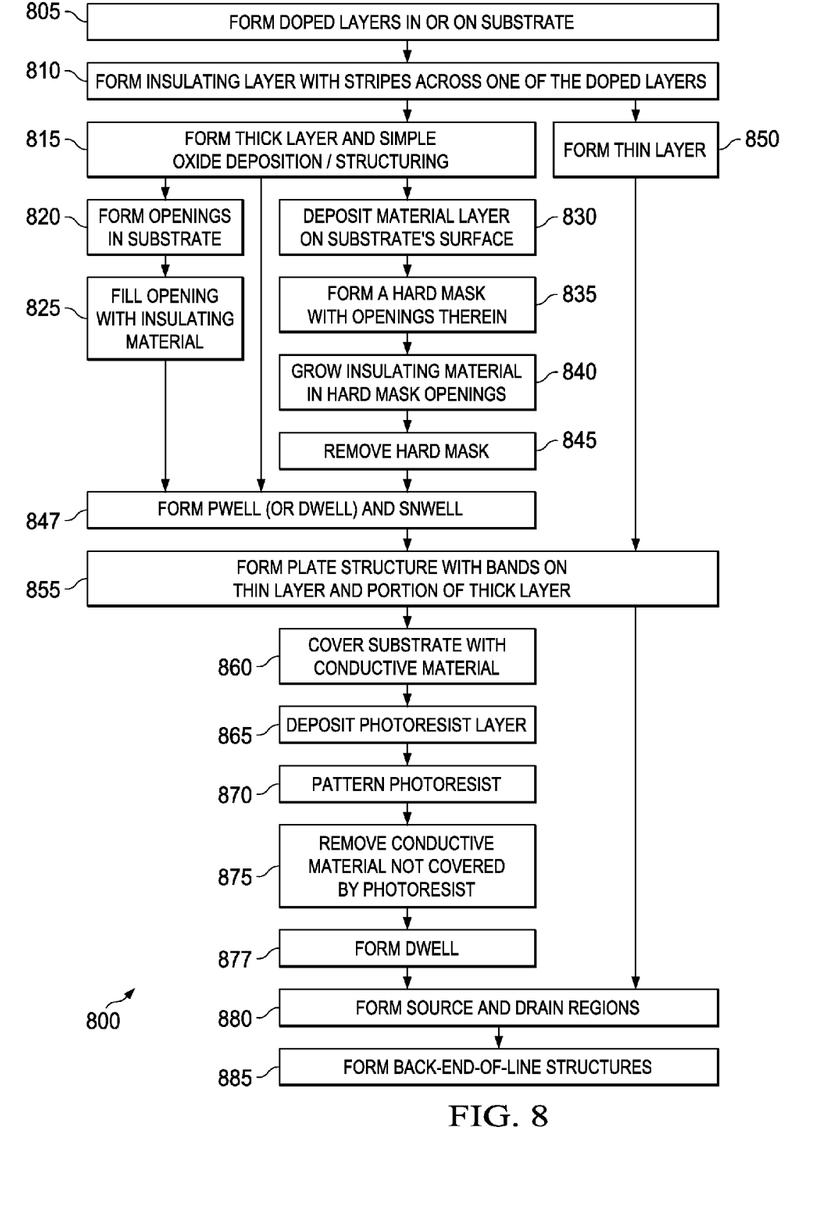
FIG. 8 is a flow diagram of an example method of manufacturing a semiconductor device according to the principles of the present disclosure.

Another aspect of the disclosure is a method of manufacturing a semiconductor device. Any of the semiconductor devices 100 discussed above in the context of FIGS. 1-7 can be made according to the method. FIG. 8 presents a flow diagram of an example method 800 of manufacturing a semiconductor device according to the principles of the present disclosure.

In step 805, one or more doped layers are formed in or on a semiconductor substrate. For instance, doped buried layers (e.g., the n+-doped buried layer 150 and p-doped reduced surface field layer 170) can be formed by implanting n-type or p-type dopants, respectively, into substrate (e.g., silicon wafer 152), followed by a first thermal diffusion process (e.g., at least about 1000° C. for at least about 60 minutes). Next, one or more silicon layers are grown, or formed by non-epitaxial process, and doped wells or layers (e.g., deep n-doped well 155, p-doped reduced surface field layer 170) can be formed, e.g., in such epitaxial layers by implanting dopants (eventually at different depths using high energy implantation) and applying a thermal diffusion process, similar to that described above for forming the doped buried layers.

In step 810, an insulating region 115 is formed in or on the semiconductor substrate, and over and aligned with one of the doped layers formed in step 810 or another layer in the process flow used in another device integrated on the same substrate or designed specifically to serve as an alignment marker. For instance, the insulating region can be aligned with the deep n-doped well 155, the deep n-doped well 155 being configured as a drain extension between intended locations of the channel 157 and drain region 107 of the device 100.

Forming the insulating region 115 in step 810 includes a step 815 of forming a thick layer 122 with a plurality of insulating fingers 132 that are separated from each other and that extend across a length of a second one of the doped layers of the substrate (e.g., n-doped epitaxial layer or deep n-doped well 155). In some embodiments, forming the thick layer 122 in step 815 can include a step 820 of forming one or more openings (e.g., one or more trenches formed by a dry etch process such as reactive ion etching) in the semiconductor substrate. At least some of the openings correspond to the locations of the insulating fingers. Forming the thick layer in step 815 can also include a step 825 of filling such openings with an insulating material to form the insulating fingers. For example, the opening can be filled with an insulating material (such as silicon oxide and silicon nitride) using chemical vapor deposition (CVD) or other conventional deposition process. The filling oxide can be polished back down to the silicon surface level using, e.g., chemical-mechanical polishing (CMP).

In other embodiments, forming the thick layer in step 815 can include a step 830 of depositing a material layer on the semiconductor substrate to form the insulating fingers. For instance in step 835 a material layer comprising a hard mask material (e.g., a nitride layer) can be deposited on the substrate surface and openings can be formed in the hard mask using photolithographic patterning and etching processes, or other conventional structuring techniques. The openings in the hard mask correspond to the intended locations of the insulating fingers. In step 840, an insulating material can be grown in these openings on the substrate surface (e.g., a field oxide can be grown by wet oxidation on portions of the substrate not covered by the hard mask). Then, in step 845, the hard mask can be removed (e.g., via a conventional dry etch), leaving the insulating fingers on the substrate.

In a further embodiment, a dielectric layer can be deposited onto the surface of the substrate and structured using conventional lithography techniques. In some embodiments, these methods can be repeated or combined with each other to form multiple (continuous or stepped) thickness insulating fingers 132.

Some embodiments include a step 847 of forming the p-doped well 160 (FIG. 1A), or optionally a double-diffused well, and shallow well 165 (FIG. 1A) after forming the thick layer in step 815.

Forming the insulating region in step 810 also includes a step 850 of forming a thin layer (e.g., thin layer 120) on an upper surface (e.g., surface 127) of the semiconductor substrate. For example, the thin layer can be formed by growing a thermal silicon oxide coating on the substrate's surface.

The method 800 also includes a step 855 of forming a plate structure on the thin layer and portions of the thick layer. The plate structure has one or more conductive bands 143 that are directly over respective individual ones of the plurality of insulating fingers 132. In some embodiments, forming the plate structure in step 855 further includes: a step 860 of covering the semiconductor substrate with a conductive material (e.g., polysilicon); a step 865 of depositing a layer of photoresist material on the conductive material; a step 870 of patterning the photo resist layer so as to uncover portions of the conductive material; and a step 875 of removing the uncovered portions of the conductive material, as well as of the underlying thin insulating layer.

Some embodiments include a step 877 of forming the double-diffused well 160 (FIG. 1A) that in self-alignment with the gate electrode structure 140.

The method 800 can further include a step 880 of forming source and drain regions 105, 107 in or on the semiconductor substrate, wherein the insulating region 115 is located between the source and drain regions. For instance, one or both of portions of the insulating region (e.g., the thick layer 122) and plate structure (e.g., the conductive segment 145, FIG. 2) can be used as alignment markers so that dopants implanted into the semiconductor substrate to form the source and drain regions, and other doped regions, are properly aligned with these structures. One skilled in the art would understand that the method 800 could include additional steps 885 to complete the manufacture of the semiconductor device, including processes to form various back-end-of-line structures (e.g., insulating layers and interconnect structures).

Those skilled in the art to which the disclosure relates will appreciate that other and further additions, deletions, substitutions and modifications may be made to the described example embodiments, without departing from scope of the disclosure.

What is claimed is:

1. A semiconductor device, comprising:
    source and drain regions on or in a semiconductor substrate;
    an insulating region on or in said semiconductor substrate and located between said source and drain regions, said insulating region having a thin layer and a thick layer, wherein said thick layer includes a plurality of insulating fingers that are separated from each other and that extend across a length between said source and said drain regions; and
    a plate structure located between said source and said drain regions, wherein said plate structure is located on said thin layer and portions of said thick layer, said plate structure having one or more conductive bands that are directly over individual ones of said plurality of insulating fingers.

2. The device of claim 1, wherein said plate structure comprises a conductive segment adjacent to, and substantially traversing a width of, said source region.

3. The device of claim 2, wherein said one or more conductive bands are continuous with, and project perpendicularly from, said conductive segment.

4. The device of claim 2, wherein said one or more conductive bands are separated from said conductive segment.

5. The device of claim 2, wherein one or more of said plurality of insulating fingers are separated from said conductive segment.

6. The device of claim 1, wherein said plate structure consists essentially of said one or more conductive bands.

7. The device of claim 1, wherein said plate structure comprises one of more conductive segments adjacent to, and substantially traversing a width of, said source region, wherein:
    said one or more conductive bands are continuous with, and project perpendicularly from, said conductive segments said, and
    said conductive segments and said conductive bands are separated from each other.

8. The device of claim 1, wherein one or more electrode contacts touch portions of said plate structure that lie directly over portions of said thick layer.

9. The device of claim 2, wherein said conductive segment overlaps at least one of said plurality of insulating fingers.

10. The device of claim 1, wherein there is a gap between an edge of said conductive segment and tips of said insulating fingers.

11. The device of claim 1, wherein at least one of said one or more conductive bands has at least two different widths that are over at least one of said insulating fingers.

12. The device of claim 1, wherein at least one of said one or more conductive bands has a continuously varying width over at least one of said insulating fingers.

13. The device of claim 1, wherein one or more of said plurality of thick layers extend over said drain region and across said length, and across a second length between said drain region and a second source region.

14. An integrated circuit, comprising:
    one of more transistors on or in a semiconductor substrate, at least one of said transistors including:
        a p-doped source region in an n-doped well of said substrate;
        a p-doped drain region in a deep p-doped well of said substrate;
        an insulating region on or in said deep p-doped well of said substrate and located between said source and drain regions, said insulating region having a gate dielectric layer and a shallow trench isolation layer, wherein said shallow trench isolation layer includes a plurality of insulating fingers that are separated from each other and that extend across a length between said source and said drain regions; and a gate electrode structure located between said source and said drain regions and on said gate dielectric layer and on portions of said shallow trench isolation layer, said gate electrode structure having one or more conductive bands that are directly over individual ones of said plurality of insulating fingers;

insulating layers on said semiconductor substrate and covering said one or more transistors; and interconnects formed through one or more of said insulating layers to electrically connect said one or more transistors to each other, or to other active or passive components of said integrated circuit.

15. An integrated circuit, comprising:
one of more transistors on or in a semiconducting substrate, at least one of said transistors including:
  an n-doped source region in a p-doped well of said substrate;
  an n-doped drain region in a deep n-doped well of said substrate;
  an insulating region on or in said deep n-doped well of said substrate and located between said source and drain regions, said insulating region having a gate dielectric layer and a shallow trench isolation layer, wherein said shallow trench isolation layer includes a plurality of insulating fingers that are separated from each other and that extend across a length between said source and said drain regions; and
  a gate electrode structure located between said source and said drain regions and on said gate dielectric layer and on portions of said shallow trench isolation layer, said gate electrode structure having one or more conductive bands that are directly over individual ones of said plurality of insulating fingers;
insulating layers on said semiconductor substrate and covering said one or more transistors; and
interconnects formed through one or more of said insulating layers to electrically connect said one or more transistors to each other, or to other active or passive components of said integrated circuit.

16. The transistor of claim 15, wherein said at least one transistor is a lateral double-diffused MOS transistor or a drain extended MOS transistor.

17. The transistor of claim 15, wherein a thickness of at least one of said insulating fingers varies in at least one of a longitudinal direction between said source region and said drain region or a lateral direction between a center an edge of said at least one insulating finger.

18. The device of claim 1, wherein:
said semiconductor substrate includes well region of first-type conductivity and a deep well region of second-type conductivity;
said source region comprises a source region of the second-type conductivity in said well region of the first-type conductivity;
said drain region comprises a drain region of the second-type conductivity in said deep well region of the second-type conductivity;
said insulating region is located on or in said deep well region of the second-type conductivity;
said thin layer comprises a gate dielectric layer;
said thick layer comprises a shallow trench isolation layer including said plurality of insulating fingers; and
said plate structure comprises a gate electrode structure located on said gate dielectric layer and on portions of said shallow trench isolation layer, said gate electrode structure having said one or more conductive bands.

19. The device of claim 1, wherein said first-type conductivity is n-type; and said second-type conductivity is p-type.

20. The device of claim 1, wherein said device comprises a lateral double-diffused MOS transistor or a drain extended MOS transistor.

21. The device of claim 1, wherein a thickness of at least one of said insulating fingers varies in at least one of a longitudinal direction between said source region to said drain region or a lateral direction between a center and an edge of said at least one insulating finger.

22. The device of claim 1, further comprising insulating layers on said semiconductor substrate and covering said source and drain regions, said insulating region, and said plate structure; and interconnects formed through one or more of said insulating layers to electrically connect said source and drain regions and said plate structure to each other, or to other active or passive components of said device.

* * * * *